United States Patent [19]
Koshiishi

[11] Patent Number: 5,928,963
[45] Date of Patent: Jul. 27, 1999

[54] PLASMA ETCHING METHOD

[75] Inventor: Akira Koshiishi, Kofu, Japan

[73] Assignee: Tokyo Electron Limited, Tokyo, Japan

[21] Appl. No.: 08/736,428

[22] Filed: Oct. 24, 1996

[30] Foreign Application Priority Data

Oct. 26, 1995 [JP] Japan .................................. 7-302139

[51] Int. Cl.$^6$ .................................................. H01L 21/00
[52] U.S. Cl. .................... 438/714; 438/719; 438/725; 438/723; 216/75; 216/79; 216/67
[58] Field of Search ..................................... 438/710, 714, 438/719, 720, 723, 725; 216/67, 75, 77, 79

[56] References Cited

U.S. PATENT DOCUMENTS

| | | | |
|---|---|---|---|
| 4,260,649 | 4/1981 | Dension et al. | 427/53.1 |
| 4,581,101 | 4/1986 | Senoue et al. | 156/643 |
| 4,891,118 | 1/1990 | Ooiwa et al. | 204/298 |
| 5,435,886 | 7/1995 | Fujiwara et al. | 156/643.1 |
| 5,468,341 | 11/1995 | Samukawa . | |
| 5,476,807 | 12/1995 | Lee et al. | 437/52 |
| 5,503,901 | 4/1996 | Sakai et al. . | |

FOREIGN PATENT DOCUMENTS

| | | |
|---|---|---|
| 06267900 | 9/1994 | Japan . |
| 07074145 | 3/1995 | Japan . |

OTHER PUBLICATIONS

"Some Chemical Aspects of the Fluorocarbon, Plasma Etching of Silicon and its Compounds". IBM J. Res. Develop. vol. 23, No. 1, pp. 33–41, Jan. 1979.

J.W. Butterbaugh, et al.; "Plasma–surface interactions in fluorocarbon etching of silicon dioxide"; Journal of Vacuum Science & Technology B; vol. 9, No. 3, Jun. 1991, New York US; pp. 1461–1470.

Yasuhiro Horiike, et al.; "High rate and highly selective SiO2 etching employing inductively coupled plasma and discussion on reaction kinetics"; Journal of Vacuum Science and Technology, Part A, vol. 13, No. 3, Jun. 1995, New York US; pp. 801–809.

*Primary Examiner*—R. Bruce Breneman
*Assistant Examiner*—Luz Alejandro
*Attorney, Agent, or Firm*—Oblon, Spivak, McClelland, Maier & Neustadt, P.C.

[57] ABSTRACT

A contact hole is formed in an $SiO_2$ film on a silicon wafer by a plasma etching, using a photoresist as a mask. A process gas is a mixture of an etching gas of HFPO and a carrier gas of Ar at a volume ratio of from 1:17.5 to 1:20. The process gas is fed into a process chamber which houses the silicon wafer and is set at a pressure of from 10 mTorr to 100 mTorr. The process gas is turned into plasma by electric discharge, and the $SiO_2$ film is subjected to etching with the plasma. During the etching, the target surface of the wafer is kept at a temperature of from 50° C. to 100° C. The etching gas of HFPO is represented by a structural formula as follows:

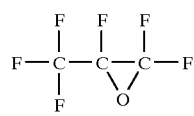

22 Claims, 3 Drawing Sheets

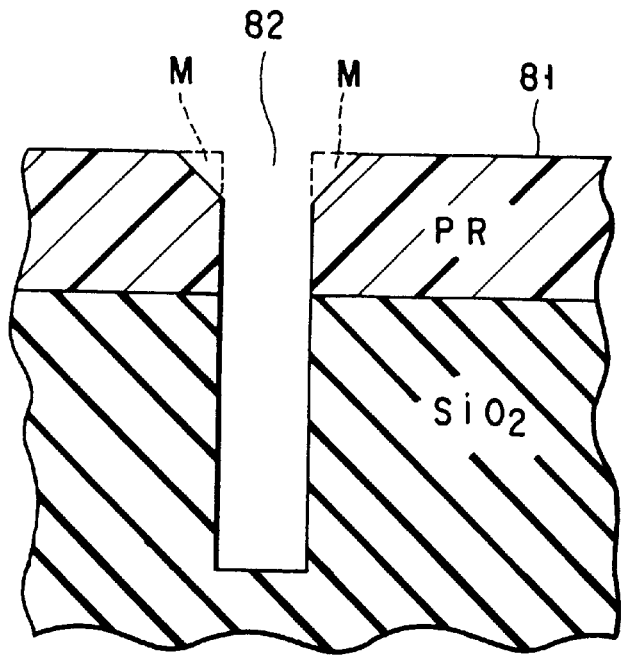
F I G. 3
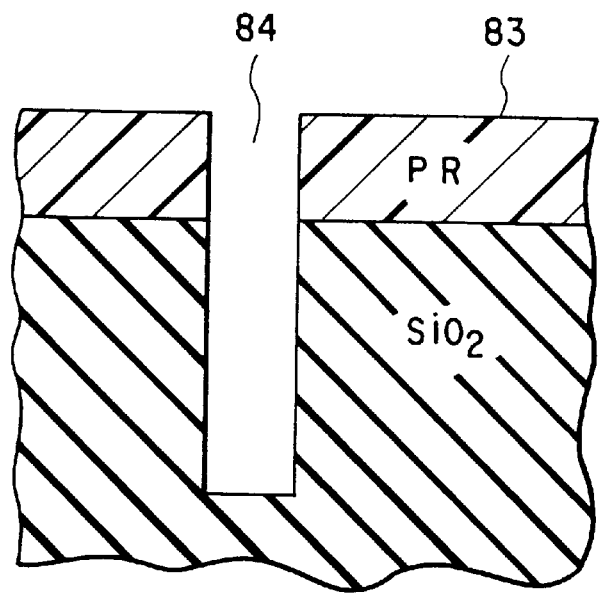
F I G. 4

PLASMA ETCHING METHOD

BACKGROUND OF THE INVENTION

1. Field of the Invention

The present invention relates to a method of plasma-etching a target layer comprising silicon oxide, and a process gas used in the method.

2. Description of the Related Art

With an increase in the degree of integration level of semiconductor devices, such techniques as can etch a target object accurately in accordance with a design have become more important. An error between a designed dimension and an etched dimension is used as a criterion in etching and referred to as a technical term, critical dimension loss (CD loss).

For example, in these days, it is necessary to form a contact hole having a diameter of 0.3 μm and a high aspect ratio in a silicon-oxide-based layer, such as an $SiO_2$ film, which is widely used as an interlevel insulating film. In this case, if an etching selection ratio of the silicon oxide film to a photoresist is low, a little CD loss is generated due to retreatment of the photoresist, so that the yield is greatly affected.

On the other hand, with an increase in the diameter of target substrates to be processed, such as semiconductor wafers, etching apparatuses for processing the substrates one by one have become the main current, in order to perform a uniform and fine process. The etching apparatuses of the above described one-by-one type require a high etching rate, so that a high throughput is obtained. In order to meet this demand, the etching apparatuses currently used are constituted such that plasma of a high density is generated in a process chamber, thereby ensuring a high etching rate.

Gases based on CxFy are generally used as an etching gas for plasma-etching a silicon-oxide-based layer, such as an $SiO_2$ film. Among the CxFy-based gases, a gas, in which x:y=1:2, such as $C_4F_8$ gas, is representative, since such a gas provides an excellent balance between a high etching selection ratio and a high etching rate. If the ratio between C and F in an etching gas is deviated from an optimum value, the etching ratio may be decreased, or the etching rate is decreased due to an amount of by-product deposition, such as carbide.

The $C_4F_8$ gas is generally used under a low pressure of less than 10 mTorr, so that it is difficult to control the dissociation of the gas. As a result, problems are apt to occur such that fluorine-contained radicals are produced excessively so as to decrease the etching selection ratio, or fluorine-contained radicals are insufficient so as to cause a deposition to adhere and decrease the etching rate. Further, the etching rate and the aspect ratio presented by the $C_4F_8$ gas are not satisfactory in consideration of a high throughput and a high degree of integration level currently required, even if the $C_4F_8$ gas is accurately controlled over its dissociation. Furthermore, the $C_4F_8$ gas is apt to generate a "sloping shoulder" at the opening of a contact hole when forming the contact hole in practice, even if the etching selection ratio of a silicon oxide film to a photoresist is set at a high value, thereby presenting a larger CD loss in reality.

SUMMARY OF THE INVENTION

Therefore, the present invention has an object, to provide a plasma etching method which can present a high etching rate and a low CD loss, and a process gas used in the method.

The present invention also has an object, to provide a plasma etching method in which gas dissociation is easily controlled under a relatively high pressure of, e.g., from 10 mTorr to 100 mTorr, and a process gas used in the method.

According to a first aspect of the present invention, there is provided a process gas to be turned into plasma, which is used for etching a target layer comprising silicon oxide in a plasma etching method, the process gas including an etching gas represented by a structural formula as follows:

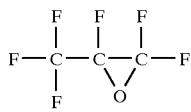

The etching gas according to the first aspect has a chemical formula of $CF_3CFOCF_2$ or $C_3F_6O$, and a chemical name of hexafluoropropene oxide, which will be referred to as HFPO. HFPO is a colorless and odorless gas having a boiling point of $-27.4°$ C. and a vapor pressure of 5144.15 mmHg at $21°$ C.

According to a second aspect of the present invention, there is provided a plasma etching method comprising the steps of:

loading a substrate having a first layer in a process chamber;

feeding a process gas into the process chamber;

turning the process gas into plasma by causing electric discharge; and etching the first layer, using the plasma;

wherein the first layer comprises silicon oxide, and the process gas includes the etching gas according to the first aspect.

According to a third aspect of the present invention, there is provided a process gas to be turned into plasma, which is used for etching a target layer comprising silicon oxide in a plasma etching method, the process gas including an etching gas represented by a structural formula as follows:

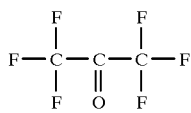

The etching gas according to the third aspect has a chemical formula of $CF_3COCF_3$ or $C_3F_6O$, and a chemical name of hexafluoroacetone, which will be referred to as HFA. HFA is a colorless and odorless gas having a boiling point of $-26°$ C., a vapor pressure of 4525.0 mmHg at $21.1°$ C., a melting point of $-129°$ C., and a specific gravity of 1.65 (The Sigma-Aldrich Library of Chemical Safety Data Edition II).

According to a fourth aspect of the present invention, there is provided a plasma etching method comprising the steps of:

loading a substrate having a first layer in a process chamber;

feeding a process gas into the process chamber;

turning the process gas into plasma by causing electric discharge; and etching the first layer, using the plasma;

wherein the first layer comprises silicon oxide, and the process gas includes the etching gas according to the third aspect.

The etching gases according to the present invention are easily controlled over their dissociation under a relatively high pressure of 10 mTorr to 100 mTorr. The gases can present an etching rate and an aspect ratio both higher than those of conventional $C_4F_8$, and an excellent etching property without a "sloping shoulder" in an etched shape. Furthermore, where etching is performed by a plasma etching method according to the present invention, there is provided an advantage in that little deposition is adhered.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is an enlarged cross sectional view showing a state where a contact hole is formed in a silicon oxide film on a wafer by etching with $C_4F_8$ which is conventionally used; and FIG. 4 is an enlarged cross sectional view showing a state where a contact hole is formed in a silicon oxide film on a wafer by etching with HFA or HFPO according to the present invention.

DETAILED DESCRIPTION OF THE PREFERRED EMBODIMENTS

Figure 1:
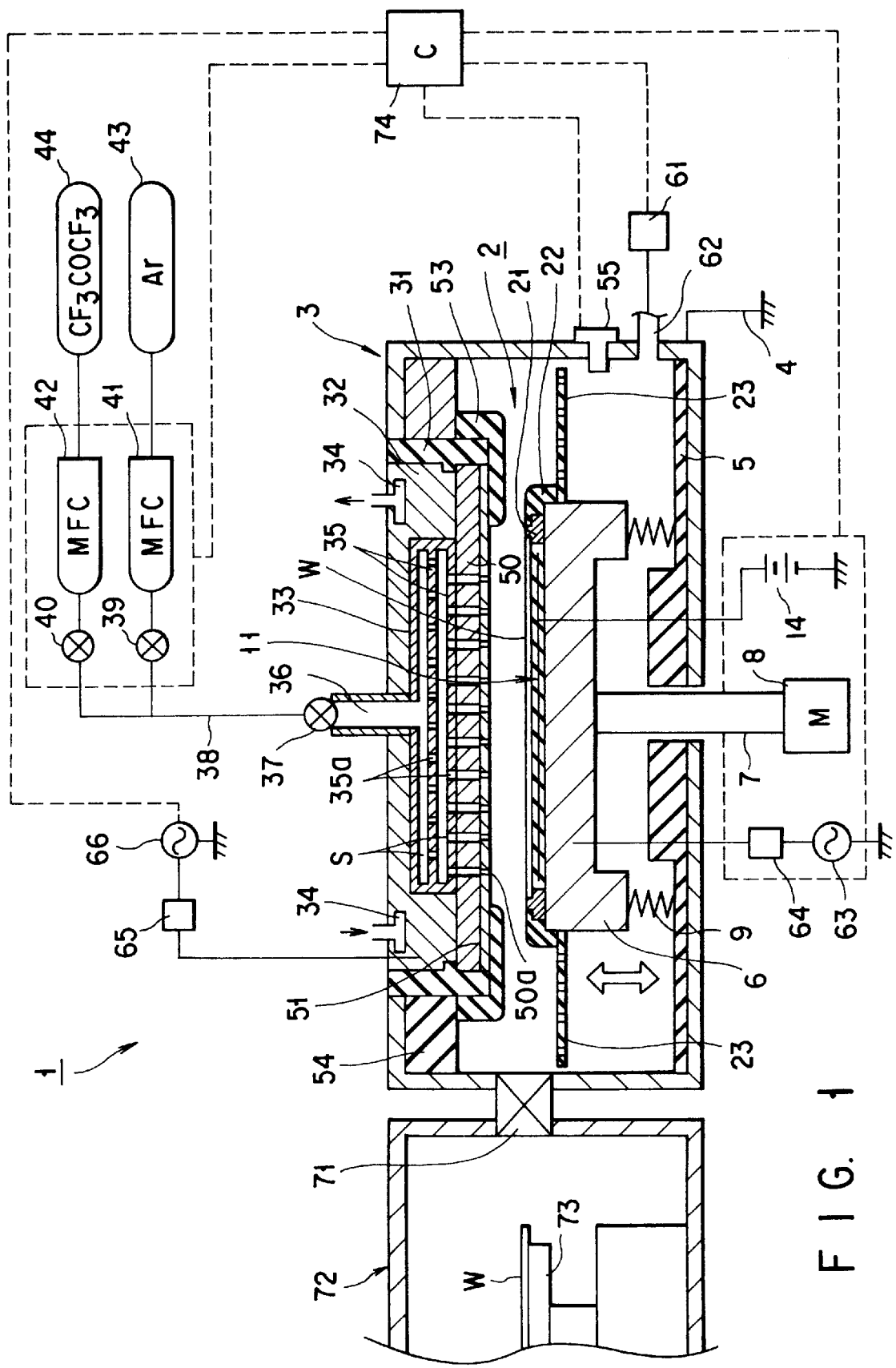
FIG. 1 is an explanatory cross sectional view showing an etching apparatus to be used for performing a plasma etching method according to an embodiment of the present invention.

FIG. 1 is an explanatory cross sectional view showing an etching apparatus 1 to be used for performing a plasma etching method according to an embodiment of the present invention.

The etching apparatus 1 has a process field 2 formed in a cylindrical process chamber 3 which can be hermetically closed. The process chamber 3 is made of, e.g., aluminum subjected to an alumite treatment by oxidation, and is grounded through a ground line 4. An insulating support plate 5 made of, e.g., ceramics is disposed on the bottom of the process chamber 3. A susceptor 6 similar to a cylindrical column is arranged above the insulating support plate 5 for supporting thereon a target substrate W, such as a semiconductor wafer (which will be referred to as wafer). The susceptor 6 is movable in a vertical direction and functions as a lower electrode.

The susceptor 6 is supported by an elevating shaft 7 penetrating the bottom of the process chamber 3 and the insulating support plate 5. The elevating shaft 7 is moved in a vertical direction by a driving motor 8 disposed outside the process chamber 3. In other words, the susceptor 6 is moved in a vertical direction by operation of the driving motor 8, as indicated by the bidirectional arrow in FIG. 1. A flexible sealing member, such as bellows 9, is arranged around the elevating shaft 7 and between the susceptor 6 and the insulating support plate 5, so as to ensure the airtightness of the process chamber 3.

The susceptor 6 is made of aluminum having an oxidized surface. Temperature adjusting means is arranged in the susceptor 6 so that the wafer 6 placed on the susceptor 6 can be kept at a predetermined temperature. For example, the temperature adjusting means is formed of heating means (not shown), e.g., a ceramic heater, and a coolant circulation passage (not shown) for circulating a coolant to and from an outside coolant source (not shown). The temperature of the wafer W is automatically controlled by a temperature sensor (not shown) and a temperature control mechanism (not shown).

Figure 2:
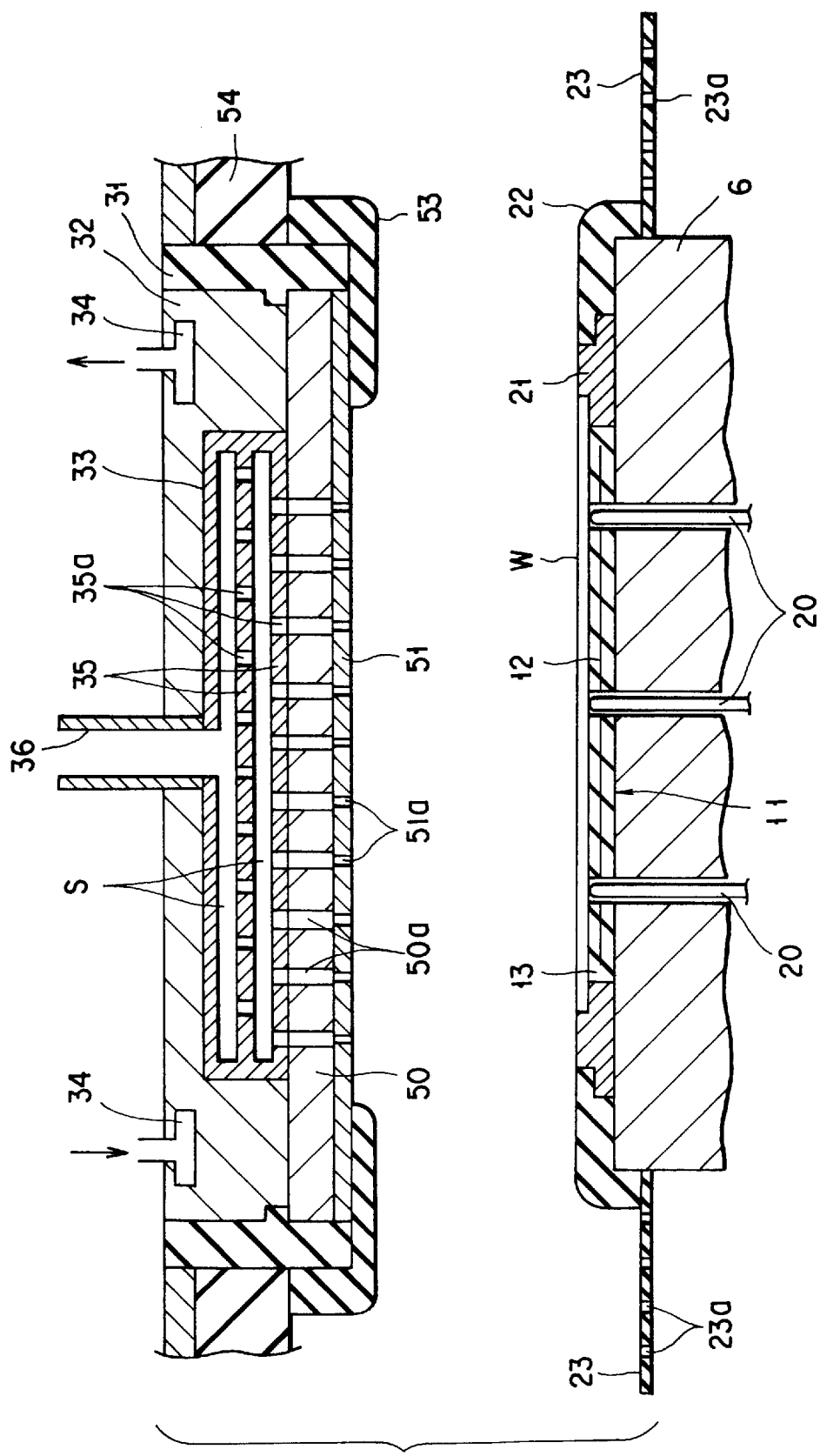
FIG. 2 is an enlarged explanatory view showing the main part around the upper electrode of the etching apparatus shown in FIG. 1.

An electrostatic chuck 11 is disposed on the susceptor 6, for attracting and holding the wafer W. As shown in FIG. 2, the electrostatic chuck 11 is constituted such that a conductive thin film 12 is interposed by polyimide series resin films 13. When a voltage of, e.g., from 1.5 kV to 2 kV is applied to the thin film 12 from a high DC power supply 14 disposed outside the process chamber 3, the wafer W is attracted and held on the top surface of the electrostatic chuck 11 by a Coulomb's force generated at this time.

As shown in FIG. 2, a plurality of lifter pins 20, such as three pins, are arranged in the susceptor 6 as support means for transferring the wafer to and from the electrostatic chuck 11. The lifter pins 20 can lift up the wafer W from the electrostatic chuck 11 by moving in a vertical direction relative to the susceptor 6.

An inner focus ring 21 having an essentially circular shape in its plan view is disposed on the periphery of the susceptor 6 so as to surround the electrostatic chuck 11. The inner focus ring 21 is made of a conductive material, such as single crystalline silicon, so as to cause plasma to expand beyond the wafer W, and to allow ions in the plasma to be effectively radiated onto the wafer W.

An outer focus ring 22 having an essentially circular shape in its plan view is disposed around the inner focus ring 21. The outer focus ring 22 is made of an insulating material, such as quartz, and its outer upper edge is formed to have a curved shape projecting outward so as to allow gases to be smoothly exhausted without stagnation. The outer focus ring 22 cooperates with a shield ring 53 described later, so as to suppress diffusion of plasma generated between the susceptor 6 and an upper electrode 51 described later.

A baffle plate 23 made of, e.g., an insulating material, is arranged around the susceptor 6. The inner portion of the baffle plate 23 is fixed to the susceptor 6 by means of, e.g., bolts, through a support body made of, e.g., quartz. As a result, the baffle plate 23 is moved in a vertical direction along with the susceptor 6. A number of through holes 23a are formed in the baffle plate 23, for uniformly exhausting gases.

A diffusion member 33 is arranged at the upper position of the process chamber 3 through an insulating support 31 and a cooling member 32 made of aluminum, for feeding an etching gas and other gases in the process field 2. A coolant circulation passage 34 is formed in the upper part of the cooling member 32. A chiller or coolant fed from the outside is circulated in the coolant circulation passage 34, so that the upper electrode 51 described later can be cooled down to a predetermined temperature.

As shown in FIG. 2, the diffusion member 33 has a hollow structure in which two levels of baffle plates 35 are arranged on the lower side. Each of the two levels of baffle plates 35 is provided with a number of diffusion holes 35a, such that the upper holes 35a do not overlap the lower holes 35a. A gas inlet 36 is formed at the center of the diffusion member 33, and is connected to a gas feed pipe 38 through a valve 37. Gas supply sources 43 and 44 are connected to the gas feed pipe 38 through respective valves 39 and 40, and respective mass flow controllers 41 and 42 for adjusting flow rates.

An etching gas according to this embodiment, i.e., HFA or HFPO, can be fed from the gas supply source 43. On the other hand, an inactive gas, such as a rare gas, e.g., argon (Ar) or helium (He), or nitrogen gas, can be fed from the gas supply source 44.

The gases from the gas supply sources 43 and 44 are introduced into the process field 2 through the gas feed pipe 38, inlet 36, and diffusion holes 35a of the diffusion member 33. A cooling plate 50 having a number of spouting holes 50a formed therein is disposed in close contact with the bottom surface of the cooling member 32. With this arrangement, as shown in FIG. 2, the gases fed into a baffle space S defined by the baffle plates 35 of the diffusion member 33 are uniformly spouted downward.

The lower electrode 51 is fixed to and in close contact with the bottom surface of the cooling plate 50, and faces the susceptor 6. The upper electrode 51 is made of single crystalline silicon, which is conductive, and electrically communicates with the cooling plate 50. The cooling plate 50 is attached to the periphery of the bottom surface of the cooling plate 50 by means of bolts (not shown). A number of spouting holes 51a are formed in the upper electrode 51 and communicate with the spouting holes 50a of the cooling plate 50. As a result, the gases fed in the baffle space S are uniformly spouted toward the wafer W placed on the electrostatic chuck 11 through the spouting holes 50a and 51a of the cooling plate 50 and upper electrode 51.

The shield ring 53 is disposed on the periphery of the bottom surface of the upper electrode 51 so as to cover the above described fixing bolts (not shown). The shield ring 53 is made of quartz, which is insulating, and cooperates with the outer focus ring 22 so as to form a gap narrower than that between the electrostatic chuck 11 and the upper electrode 51, thereby suppressing diffusion of plasma. An insulating ring 54 made of fluorine series resin is disposed between the upper end of the shield ring 53 and the ceiling wall of the process chamber 3.

A pressure sensor 55 is attached on a side of the process chamber, for detecting the vacuum pressure of the process chamber 3. A detected signal of the vacuum pressure detected by the sensor 55 is inputted in a controller 74 described later, so that the vacuum pressure in the process chamber 3 is monitored all the time.

An exhaustion pipe 62 is connected to the lower part of the process chamber 3 and communicates with vacuum exhausting means 61, such as a vacuum pump. The process field 2 can be vacuum-exhausted down to a predetermined vacuum pressure of, e.g., from 10 mTorr to 100 mTorr, by the vacuum exhausting means 61 through the baffle plate 23 disposed around the susceptor 6.

The radio frequency (RF) power supply system of the etching apparatus is constituted as follows: The susceptor 6 used as the lower electrode is supplied with an RF power having a frequency of about several hundred kHz, such as 800 kHz, from an RF power supply 63 through a matching circuit 64. On the other hand, the upper electrode is supplied with an RF power having a frequency higher than that of the RF power supply 63 and equal to or higher than 1 MHz, such as 27.12 MHz, from an RF power supply 66 through a matching circuit 65, and the cooling member 32 and cooling plate 50.

A load lock chamber 72 is arranged adjacent to one side of the process chamber through a gate valve 71. Transfer means 73, such as a transfer arm, is arranged in the load lock chamber 72, for transferring the target substrate or wafer W to and from the process field 2 in the process chamber 3.

In the control system of the etching apparatus, the driving motor 8 for moving the susceptor 6 in a vertical direction, the high DC power supply 14, the lifter pins 20 arranged in the susceptor 6, the valves 39 and 40, the mass flow controllers 41 and 42, the vacuum exhausting means 61, and the RF power supplies 63 and 66 are controlled by the controller 74.

An explanation will be given in relation to a method of etching an oxide film or $SiO_2$ film on a silicon wafer W, under control of the controller 74, in the etching apparatus according to the embodiment of the present invention, which has the main part as described above.

At first, the gate valve 71 is opened, and the wafer W is loaded into the process chamber 3 by the transfer means 73. At this time, the susceptor 6 has been lowered at its lower position, and the lifter pins 20 are in a waiting state where they project from the electrostatic chuck 11 so as to receive the wafer W. Then, the wafer W loaded into the process chamber 3 by the transfer means 73 is transferred onto the lifter pins 20 projecting from the electrostatic chuck 11. After the wafer W is handed onto the lifter pins 20, the transfer means 73 is retreated and the gate valve 71 is closed.

When the transfer operation of the wafer W to the lifter pins 20 is completed, the susceptor 6 is moved up to a predetermined process position where the gap between the upper electrode 51 and the susceptor 6 is set at a value of from 10 mm to 20 mm. In synchronism with this movement, the lifter pins 20 supporting the wafer W is moved down into the susceptor 6. By doing so, as shown in FIG. 2, the wafer W is mounted on the electrostatic chuck 11. Then, a predetermined power is applied to the conductive thin film 12 of the electrostatic chuck 11 from the high DC power supply 14, so that the wafer W is attracted and held on the electrostatic chuck 11.

Then, the process chamber 3 is supplied with a process gas necessary for etching, which is a mixture of an etching gas and an carrier gas fed from the gas supply sources 43 and 44 at predetermined flow rates, while the process chamber 3 is vacuum-exhausted by the vacuum exhausting means 61. By doing so, the process chamber is set and kept at a predetermined vacuum pressure, such as 20 mTorr.

The flow rate ratio between the etching gas of HFA or HFPO and the carrier gas of an inactive gas, such as Ar, i.e., the volume ratio between the etching gas and the carrier gas in the process gas, is set to fall in a range of from 1:10 to 1:30, and preferably of from 1:17.5 to 1:20. With this ratio, it is possible to obtain an excellent etching property with less deposition.

Then, an RF power having a frequency of 27.12 MHz and a power of, e.g., 2 kW is applied to the upper electrode 51 from the RF power supply 66, so that the process gas is turned into plasma due to electric discharge caused between the upper electrode 51 and the susceptor 6. At the same time, an RF power having a frequency of 800 kHz and a power of, e.g., 1 kW is applied to the susceptor 6 from the RF power supply 64.

As the process gas is turned into plasma due to electric discharge, the process gas is dissociated in the process field so as to produce etchant ions as activated species. The etchant ions are further dissociated so as to produce activated species having smaller molecular weights, while they are attracted toward the susceptor 6 and controlled over their incident speeds by the RF power having a relatively low frequency and applied to the susceptor 6. The $SiO_2$ film on the wafer W is etched by means of the physical action and the chemical action of the activated species. During the etching, the target surface of the wafer is kept at a temperature of from 50° C. to 100° C.

As shown later, HFA and HFPO according to the present invention can present an etching rate of a silicon-oxide-based layer, such as an $SiO_2$ film, higher than that presented by $C_4F_8$. Further, HFA and HFPO can present a sufficiently large etching selection ratio of a first layer based on silicon oxide, such as an $SiO_2$ film, relative to a second layer of another material, such as SiN, Si, WSi, TiSi, Al, TiN, W, photoresist or the like. Therefore, HFA and HFPO can be used for a selective etching in which the first layer is etched in preference to the second layer.

Furthermore, another advantage of HFA and HFPO is that progress of their dissociation can be easily controlled, as compared to $C_4F_8$. Controlling the progress of their dissociation is important for a high etching rate to be obtained, and more important for a high etching selection ratio to be obtained. Upon application of an RF power to HFA and HFPO, they are dissociated by electric discharge so as to produce activated species, such as $C_2F_4$, $CF_3$, $CF_2$, $CF$, and F.

For example, assume that a first layer based on silicon oxide, such as an $SiO_2$ film, is etched in preference to a second layer of another material containing Si, such as SiN, Si, WSi, or TiSi. In the radicals generated by dissociation of HFA or HFPO, their reaction with Si is promoted with an increase in content of F to decrease the etching selection ratio (the first layer/the second layer). More specifically, $C_2F_4$ exhibits a relatively high etching selection ratio, while $CF_3$, F and the like exhibit low etching selection ratios. That is, in order to increase the etching selection ratio (the first layer/the second layer), the $C_2F_4$ content must be increased.

The density ratio of $C_2F_4/CF_3$ is not less than 1 in the initial stage of dissociation of HFA or HFPO, but then becomes less than 1 from a point of time when the dissociation makes progress to a certain extent. Therefore, in order to effectively use HFA or HFPO and set the density ratio of $C_2F_4/CF_3$ not to be less than 1, progress of the dissociation of HFA or HFPO should be accurately controlled.

Similarly, it has also been found that the density ratio of $C_2F_4/CF_3$ should be not less than 1, in a case where a first layer based on silicon oxide, such as $SiO_2$ film, is etched in preference to a second layer of, e.g., Al, TiN, photoresist and the like.

Progress of the dissociation of HFA and HFPO can be controlled by adjusting their discharge duration. In other words, where a plasma etching is performed while a process gas containing HFA or HFPO is caused to flow in a process field, the discharge duration of each part of the process gas is adjusted. With this operation, it is possible to attain an optimum etching rate and etching selection ratio for etching a silicon-oxide-based layer, such as an $SiO_2$ film.

Where the RF power on the upper electrode 51 side is continuously applied, the discharge duration can be defined as a residence time of each part of the process gas in the process field 2. On the other hand, where the RF power on the upper electrode 51 side is applied in pulsation, and the discharge duration is defined as a sum of pulse widths within a residence time of each part of the process gas in the process chamber 3.

The residence time of each part of the process gas is represented by a simple equation: residence time=capacity of process chamber 3×pressure÷supply rate of process gas. More specifically, the residence time is determined by the capacity of the process chamber 3, the supply rate of the process gas, the exhaust amount of the pump, and the process pressure. The controller 74 is set based on these parameters to control the supply rate of the process gas, the exhaust rate, pulse widths of the RF power, and the like.

As described, according to the embodiment, HFA or HFPO is used as an etching gas for a silicon-oxide-based layer, thereby attaining a high etching rate. In addition, when a contact hole is formed by etching, for example, an aspect ratio higher than that of a conventional method can be presented. Furthermore, when the etching gas of HFA or HFPO is used with a photoresist, it is possible to provide a preferable etching property without a "sloping shoulder" of a contact hole.

As shown in FIG. 3, when $C_4F_8$, a conventionally representative etching gas, is used for etching an $SiO_2$ film to form a contact hole, the edge of an opening 82 formed in a photoresist 81 is cut out, as indicated with portions M surrounded by broken lines in FIG. 3. As a result, even if the etching selection ratio of the $SiO_2$ to the photoresist can be set at a high value, the CD loss obtained in practice is large, thereby lowering the real etching selection ratio.

In contrast, as shown in FIG. 4, when HFA or HFPO according to the present invention is used, an etching property is provided such that the edge of an opening 84 formed in a photoresist 83 is not cut out. As a result, even if the etching selection ratio of the $SiO_2$ to the photoresist, presented by HFA and HFPO, is nominally equal to or lower than that presented by $C_4F_8$, the CD loss obtained in practice is small, thereby maintaining the real etching selection ratio at a high value.

The flow rate ratio between the etching gas of HFA or HFPO and the carrier gas of an inactive gas, such as Ar, i.e., the volume ratio between the etching gas and the carrier gas in the process gas, is set to fall in a range of from 1:10 to 1:30, and preferably of from 1:17.5 to 1:20. With this ratio, it is possible to obtain an excellent etching property with less deposition.

EXPERIMENTS

A contact hole was formed in an $SiO_2$ film by plasma etching, with a photoresist used as a mask, in each of the experiments using $C_4F_8$, and HFA and HFPO, respectively, as an etching gas. In each experiment, the flow rate ratio between the etching gas and a carrier gas of Ar was set at 1:17.5, the pressure in the process chamber 3 at 20 mTorr, the frequency and the power of the RF power supply 66 at 27.12 MHz and 2 kW, the frequency and the power of the RF power supply 63 at 800 kHz and 1 kW, and the temperature of the target surface of a wafer at 80° C.

Table 1 shows etching rates (ER), etching selection ratios (SR) of the $SiO_2$ film to the photoresist, aspect ratios (AR), and CD losses (CDL) obtained in the experiments. In the CD losses shown in Table 1, symbol "○" denotes a case where no "sloping shoulder" was observed, while symbol "Δ" denotes a case where a "sloping shoulder" was observed.

As shown in Table 1, HFA and HFPO presented an etching rate and an aspect ratio higher than those presented by $C_4F_8$, and provided an excellent etching property without a "sloping shoulder". On the other hand, HFA and HFPO presented an etching selection ratio of the $SiO_2$ to the photoresist, nominally lower than that presented by $C_4F_8$.

However, as described above, since HFA and HFPO provided an excellent etching property without a "sloping shoulder", they presented a real etching selection ratio equal to or higher than that presented by $C_4F_8$.

TABLE 1

|  | ER(nm/min) | SR | AR | CDL |
|---|---|---|---|---|
| $C_4F_8$ | 70–800 | 8–9 | 5–7 | Δ |
| HFA | 1000 or more | 5–6 | 7 or more | ○ |
| HFPO | 900–1000 | 5–6 | 7 or more | ○ |

Additional advantages and modifications will readily occur to those skilled in the art. Therefore, the invention in its broader aspects is not limited to the specific details representative embodiments shown and described herein. Accordingly, various modifications may be made without departing from the spirit or scope of the general inventive concept as defined by the appended claims and their equivalents.

What is claimed is:

1. A plasma etching method for etching a substrate having a first layer, which consists essentially of silicon oxide, and a second layer, which consists essentially of a material selected from the group consisting of SiN, Si, Al, TiN, W, WSi, TiSi, and photoresist, such that said first layer is etched in preference to said second layer, said method comprising the steps of:

loading said substrate in a process chamber;

feeding a process gas into said process chamber;

turning said process gas into plasma by causing electric discharge; and etching said substrate, using said plasma;

wherein said process gas includes an etching gas represented by a structural formula as follows:

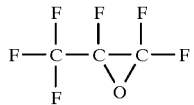

and a density ratio of $C_2F_4$ and $CF_3$, which are generated upon dissociation of said etching gas, is controlled, using a discharge duration of each part of said process gas as a parameter, in order to set an etching selection ratio of said first layer to said second layer.

2. The method according to claim 1, wherein said process gas further comprises a carrier gas consisting essentially of an inactive gas, and a volume ratio of said carrier gas to said etching gas falls in a range of from 10 to 30.

3. The method according to claim 2, wherein said carrier gas is selected from the group consisting of Ar and He.

4. The method according to claim 2, wherein said volume ratio of said carrier gas to said etching gas falls in a range of from 17.5 to 20.

5. The method according to claim 1, wherein said process chamber is set at a pressure of from 10 mTorr to 100 mTorr during said step of turning said process gas into plasma by causing electric discharge.

6. The method according to claim 1, wherein said discharge duration is selected to have a value so as to set a density ratio of $C_2F_4/CF_3$ to be not less than 1, and to have a small value with a large set value of said etching selection ratio so as to increase said density ratio.

7. The method according to claim 1, wherein an RF power for causing said electric discharge is continuously applied, and said discharge duration is defined as a residence time of each part of said process gas in said process chamber.

8. The method according to claim 1, wherein an RF power for causing said electric discharge is applied in pulsation, and said discharge duration is defined as a sum of pulse widths within it residence time of each part of said process gas in said process chamber.

9. A plasma etching method for etching a substrate having a first layer, which consists essentially of silicon oxide, and a second layer, which consists essentially of a material selected from the group consisting of SiN, Si, Al, TiN, W, WSi, TiSi, and photoresist, such that said first layer is etched in preference to said second layer, said method comprising the steps of:

loading said substrate in a process chamber;

feeding a process gas into said process chamber;

turning said process gas into plasma by causing electric discharge; and etching said substrate, using said plasma;

wherein said process gas includes an etching gas represented by a structural formula as follows:

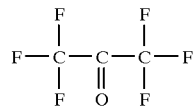

and a density ratio of $C_2F_4$ and $CF_3$, which are generated upon dissociation of said etching gas, is controlled, using a discharge duration of each part of said process gas as a parameter, in order to set an etching selection ratio of said first layer to said second layer.

10. The method according to claim 9, wherein said process gas further comprises a carrier gas consisting essentially of an inactive gas, and a volume ratio of said carrier gas to said etching gas falls in a range of from 10 to 30.

11. The method according to claim 10, wherein said carrier gas is selected from a group consisting of Ar and He.

12. The method according to claim 10, wherein said volume ratio of said carrier gas to said etching gas falls in a range of from 17.5 to 20.

13. The method according to claim 9, wherein said process chamber is set at a pressure of from 10 mTorr to 100 mTorr during said step of turning said process gas into plasma by causing electric discharge.

14. The method according to claim 9, wherein said discharge duration is selected to have a value so as to set a density ratio of $C_2F_4/CF_3$ to be not less than 1, and to have a small value with a large set value of said etching selection ratio so as to increase said density ratio.

15. The method according to claim 9, wherein an RF power for causing said electric discharge is continuously applied, and said discharge duration is defined as a residence time of each part of said process gas in said process chamber.

16. The method according to claim 9, wherein an RF power for causing said electric discharge is applied in pulsation, and said discharge duration is defined as a sum of pulse widths within a residence time of each part of said process gas in said process chamber.

17. A plasma etching method for etching a substrate having a first layer, which consists essentially of silicon oxide, and a second layer, which consists essentially of a photoresist, such that said first layer is etched in preference to said second layer, said method comprising the steps of:

loading said substrate in a process chamber;

feeding a process gas into said process chamber;
turning said process gas into plasma by causing electric discharge; and
etching said substrate, using said plasma;
wherein said process gas includes an etching gas represented by a structural formula as follows:

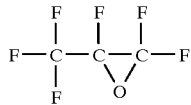

wherein said process gas further comprises a carrier gas consisting essentially of an inactive gas selected from the group consisting of Ar and He, and a volume ratio of said carrier gas to said etching gas falls in a range of from 17.5 to 20, wherein said process chamber is set at a pressure of from 10 mTorr to 100 mTorr during said step of turning said process gas into plasma by causing electric discharge, wherein a density ratio of $C_2F_4$ and $CF_3$, which are generated upon dissociation of said etching gas, is controlled, using a discharge duration of each part of said process gas as a parameter, in order to set an etching selection ratio of said first layer to said second layer, and wherein said discharge duration is selected to set and maintain the density ratio of $C_2F_4/CF_3$ to not less than 1.

18. The method according to claim 17, wherein an RF power for causing said electric discharge is continuously applied, and said discharge duration is defined as a residence time of each part of said process gas in said process chamber.

19. The method according to claim 18, wherein said method is a method of forming a contact hole in said first layer by etching said first layer, using said second layer as a mask.

20. A plasma etching method for etching a substrate having a first layer, which consists essentially of a silicon oxide, and a second layer, which consists essentially of a photoresist, such that said first layer is etched in preference to said second layer, said method comprising the steps of:

loading said substrate in a process chamber;
feeding a process gas into said process chamber;
turning said process gas into plasma by causing electric discharge; and
etching said substrate, using said plasma;
wherein said process gas includes an etching gas represented by a structural formula as follows:

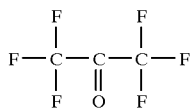

wherein said process gas further comprises a carrier gas consisting essentially of an inactive gas selected from the group consisting of Ar and He, and a volume ratio of said carrier gas to said etching gas falls in a range of from 17.5 to 20, wherein said process chamber is set at a pressure of from 10 mTorr to 100 mTorr during said step of turning said process gas into plasma by causing electric discharge, wherein a density ratio of $C_2F_4$ and $CF_3$, which are generated upon dissociation of said etching gas, is controlled, using a discharge duration of each part of said process gas as a parameter, in order to set an etching selection ratio of said first layer to said second layer, and wherein said discharge duration is selected to set and maintain the density ratio of $C_2F_4/CF_3$ to not less than 1.

21. The method according to claim 20, wherein an RF power for causing said dielectric discharge is continuously applied, and said discharge duration is defined as a residence time of each part of said process gas in said process chamber.

22. The method according to claim 21, wherein said method is a method of forming a contact hole in said first layer by etching said first layer, using said second layer as a mask.

* * * * *